United States Patent [19]

Scott et al.

[11] Patent Number: 5,343,487
[45] Date of Patent: Aug. 30, 1994

[54] ELECTRICAL PUMPING SCHEME FOR VERTICAL-CAVITY SURFACE-EMITTING LASERS

[75] Inventors: Jeffery W. Scott, Carpinteria; Larry A. Coldren, Santa Barbara, both of Calif.

[73] Assignee: Optical Concepts, Inc., Lompac, Calif.

[21] Appl. No.: 955,562

[22] Filed: Oct. 1, 1992

[51] Int. Cl.[5] ............................................. H01S 3/19
[52] U.S. Cl. ......................................... 372/46; 372/45
[58] Field of Search .................................. 372/43–48

[56] References Cited

U.S. PATENT DOCUMENTS

| | | | |
|---|---|---|---|
| 4,873,696 | 10/1989 | Coldren et al. | 372/96 |
| 4,906,839 | 3/1990 | Lee | 250/239 |
| 5,115,441 | 5/1992 | Kopf et al. | 372/45 |
| 5,115,442 | 5/1992 | Lee et al. | 372/45 |
| 5,170,407 | 12/1992 | Schubert et al. | 372/45 X |
| 5,206,872 | 4/1993 | Jewell et al. | 372/46 |
| 5,212,703 | 5/1993 | Kahen | 372/46 |
| 5,245,622 | 9/1993 | Jewell et al. | 372/45 |

OTHER PUBLICATIONS

Coldren, L. A., et al., "Progress and Problems with Vertical–Cavity Lasers," May 16, 1991, pp. 338–339, CLEO Convention '91.
Coldren, L. A., et al., "High–efficiency Vertical Cavity Lasers and Modulators", SPIE, vol. 1362, Physical Concepts of Materials for Novel Optoelectronic Device Applications II: Device Physics and Applications (Oct. 28, 1990), pp. 24–37.

Primary Examiner—John D. Lee
Attorney, Agent, or Firm—Townsend and Townsend Khourie and Crew

[57] ABSTRACT

In a vertical-cavity surface-emitting laser (VCSEL) with an active region, and first and second mirror stacks forming a resonant cavity, the VCSEL having a radial electrode configuration with a first electrode disposed around the base of the first mirror stack near one side of the active region, a second electrode on the other side of the active region with a first contacting region and a second contacting region on each side of the active region in contact with the respective electrodes, each of the contacting regions providing a current path for distributed current through the active region, the improvement wherein there is a nonlinear grading of resistivity in at least one of the contacting regions between at least one of the electrodes and the active region. Specifically, in one embodiment, the first contacting region has a first layered section abutting the first electrode which is highly conductive to radial current flow and at least a second layered section between the first layered section and the active region which is more resistive to axial current flow than to radial current flow in the first layered section. In a further embodiment, one of the two contacting regions includes a layered section which is radially graded in resistivity so as to restrict the current injection to a radius less than that of the resonant cavity, thereby improving device efficiency and preferentially supporting single mode operation.

23 Claims, 7 Drawing Sheets

Fig. 11

ELECTRICAL PUMPING SCHEME FOR VERTICAL-CAVITY SURFACE-EMITTING LASERS

This invention was made with support of the United States Government under DARPA Contract N00014-87-K-0365 managed by the Department of the Navy. The U.S. Government may have certain rights in this invention in accordance with 35 USC 202.

BACKGROUND OF THE INVENTION

This invention relates to semiconductor vertical cavity surface emitting lasers (VCSELs), and more particularly to structures and techniques for providing highly-efficient and single mode VCSELs. A VCSEL is a semiconductor laser consisting of a semiconductor layer of optically active material, such as gallium arsenide or indium gallium arsenide or the like, sandwiched between highly-reflective layers of metallic material, dielectric material, epitaxially-grown semiconductor dielectric material or combinations thereof, most frequently in stacks. As is conventional, one of the mirror stacks is partially reflective so as to pass a portion of the coherent light built up in the resonating cavity formed by the mirror stack/active layer sandwich. Laser structures require optical confinement and carrier confinement to achieve efficient conversion of pumping electrons to stimulated photons (A semiconductor may lase if it achieves population inversion in the energy bands of the active material.) The standing wave in the cavity has a characteristic cross-section giving rise to an electromagnetic mode. A desirable electromagnetic mode is the single fundamental mode, for example, the $HE_{11}$ mode of a cylindrical waveguide. A single mode signal from a VCSEL is easy to couple into an optical fiber, has low divergence and is inherently single frequency in operation.

VCSELs are known in several forms based on the location of the active layer relative to the mirror stacks and the location of the electrodes. Previously-known categories are index-guiding or gain-guiding of the optical mode, and either vertical injection (vertically along the central axis of the cavity) or lateral (radial) injection of carriers into the active region. As used herein, vertical and axial are used interchangeably and lateral and radial are used interchangeably.

Reference is made to a survey article describing the various categories entitled "High-efficiency Vertical Cavity Lasers and Modulators," by Coldren et al., SPIE Proceedings Vol. 1362 (Physical Concepts of Materials for Novel Optoelectronic Device Applications II: Device Physics and Applications, presented 28 Oct-2 Nov 1990, Aachen, Germany, Copyright 1991).

The previously-known VCSELs suffered from relatively-low power efficiencies, which can be related to geometry limitations or low pumping efficiency. Their small size and power inefficiency caused the devices to become hot as the input power is increased. Since the lasers tended to self-quench at higher temperatures, the light output power has been limited.

At high currents, vertically-injected lasers tend to overheat because of the inherent series resistance of the mirror structures, while laterally-injected lasers tend to develop non-uniform current distribution with "current crowding" at the edges of the active region as the injection current increases. As the optical mode is weak at the edges of the active region, conversion efficiency is reduced substantially. Therefore, laterally-injected structures typically have been limited to significantly lower saturated power output levels than vertically-injected lasers, due to the supposed inherent structural limitations. Moreover, due to mismatch between known injected current patterns and the desirable lateral optical modes of VCSELs, injection current patterns produced by prior art devices result in undesirable multimode behavior at elevated power levels.

Figure 1:
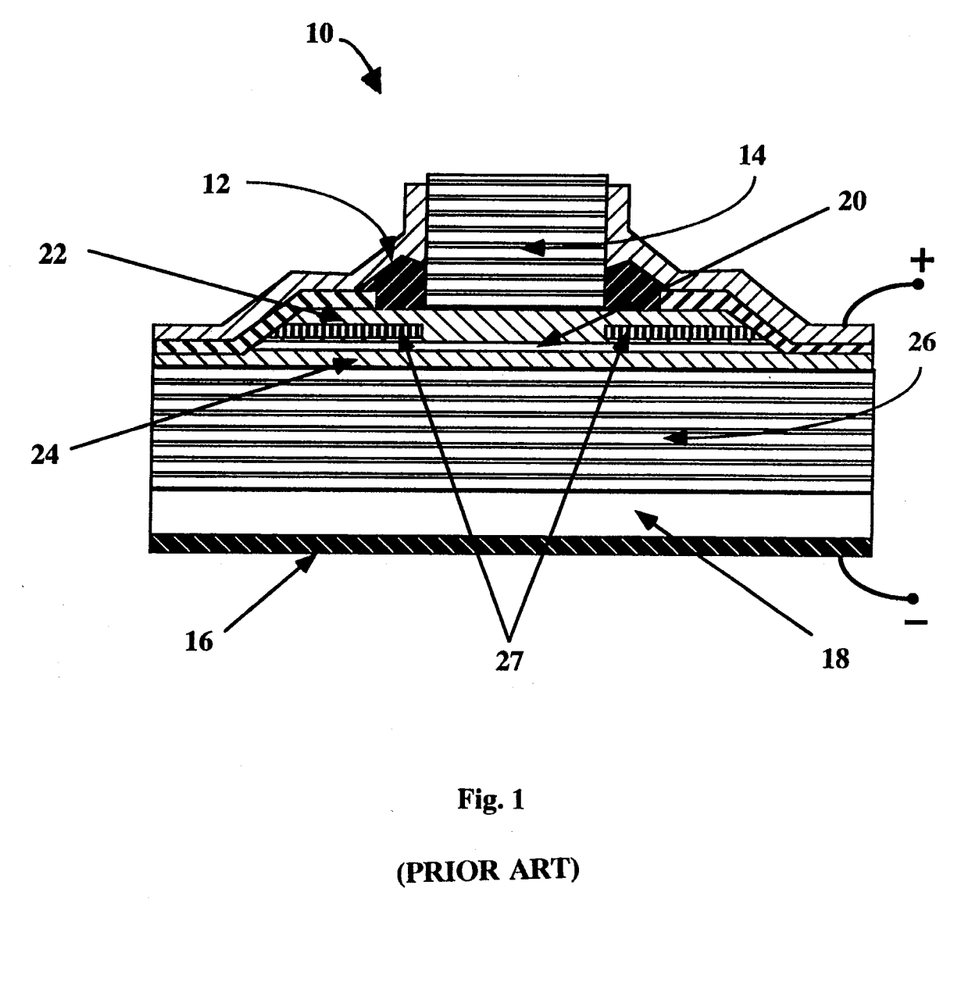
FIG. 1 is a side cross-sectional view of a prior art Vertical-Cavity Surface Emitting Laser.

A further category of VCSELs has been developed by a research group based at the University of California at Santa Barbara under the direction of one of the co-inventors, Professor Larry A. Coldren. Referring to FIG. 1, a lateral-contact VCSEL 10 was developed which has a first electrode 12 disposed as a ring or toroid around the base of a first mirror stack 14, which serves as an index waveguide, a second electrode 16 being disposed on the back of the semiconductor substrate 18 such that the active region 20, which is formed of a conventional GaAs multiple quantum well, is contacted on opposing sides by the electrodes 12 and 16 and sandwiched between first and second optically transmissive contacting layers 22, 24 abutting respectively the first mirror stack 14 and a second mirror stack 26.

The suggestion has been made in a public forum in the United States (UCSB Electrical and Computer Engineering Research Review, Santa Barbara, Calif., January 1991 and the Conference on Lasers and Electro-Optics, Anaheim, Calif., May 1991), in the course of development of the present invention, that a current confinement aperture 27 be provided around the active region to funnel current into the active region directly under the silhouette of the first mirror stack 14. The proposed current confinement aperture was to be formed by wet etching, and thus the concurrent large optical index discontinuity must be kept outside the cavity to avoid disturbing the electromagnetic mode. It is believed that a similar structure has since been incorporated into devices developed by others, such as a group headed by Jack Jewell and Greg Olbright at Photonics Research in Colorado. Further, at these public forums, it was suggested that a linear vertical grading be provided in the top or first contacting layer 22 as one technique to minimize current crowding. An attempt was made to fabricate such a device. However, deficiencies were discovered, and further research resulted in the present invention.

What is needed is a VCSEL with a structure which overcomes the inherent current crowding inefficiencies of lateral electrode configurations and the inherent power conversion inefficiencies of vertical electrode configurations.

SUMMARY OF THE INVENTION

According to the invention, in a vertical-cavity surface-emitting laser (VCSEL) with an active region, and first and second mirror stacks forming a resonant cavity, the VCSEL having a radial electrode configuration with a first electrode disposed around the base of the first mirror stack near one side of the active region, a second electrode on the other side of the active region with a first contacting region and a second contacting region on each side of the active region in contact with the respective electrodes, each of the contacting regions providing a current path for distributing current through the active region, the improvement wherein there is a nonlinear grading of resistivity in at least one of the contacting regions between at least one of the electrodes and the active region. Specifically, in one embodiment, the first contacting region has a first layered section abutting the first electrode which is highly conductive to radial current flow and at least a second layered section between the first layered section and the active region which is more resistive to axial current flow than to radial current flow in the first layered section. In a further embodiment, one of the two contacting regions includes a layered section which is radially graded in resistivity so as to establish a radially-graded current injection profile tailored to enhance the gain of the fundamental optical mode of the resonant cavity. The radially-graded aperture may be a nonlinearly-graded radial resistivity profile formed by ion implantation, diffusion or other techniques selected to avoid disturbance of the opt/cal mode.

The invention will be better understood upon reference to the detailed description in connection with the accompanying drawings.

DESCRIPTION OF SPECIFIC EMBODIMENTS

Figure 2:
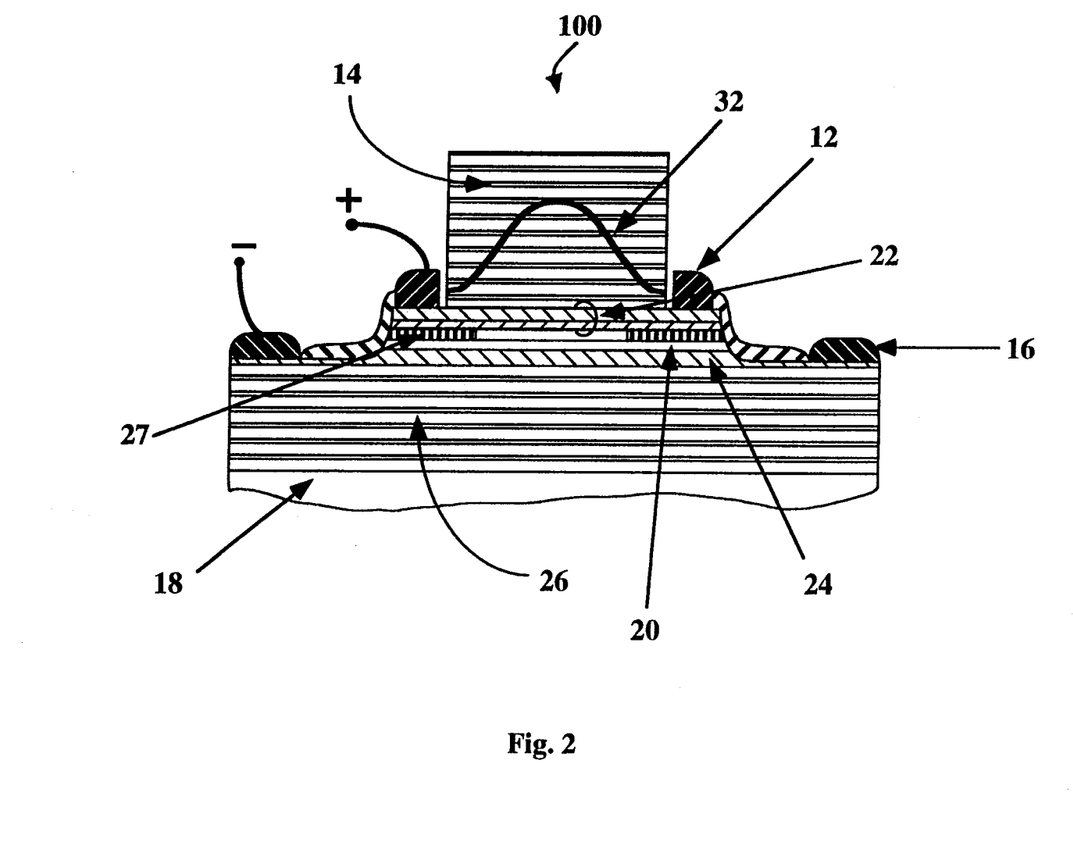
FIG. 2 is a side cross-sectional view of a VCSEL according to the invention, illustrating the electromagnetic mode.
Figure 3:
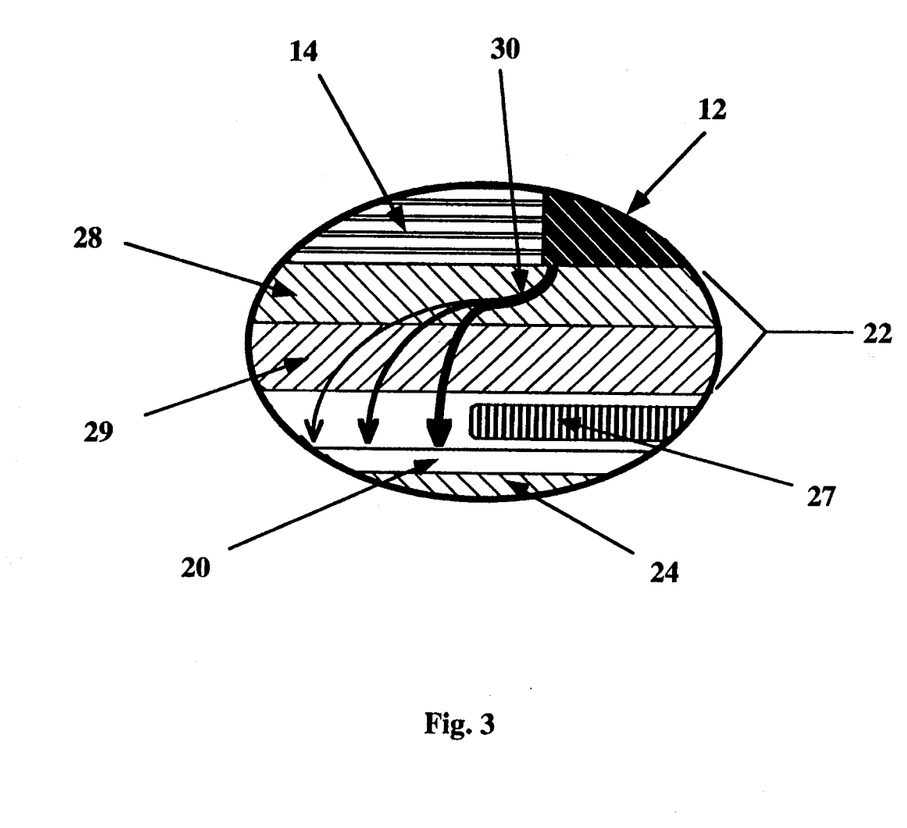
FIG. 3 is a side cross-sectional view of a detail portion of the device of FIG. 2 illustrating current flow.

Referring to FIG. 2, there is shown a vertical-cavity surface emitting laser device 100 in accordance with a specific embodiment of the invention. The laser device 100 has a first electrode 12 disposed in an inner ring or annulus around the base of a first mirror stack 14, which serves as an index waveguide, a second electrode 16 disposed in an outer ring connected electrically beneath an active region 20 on a semiconductor substrate 18 such that the active region, which is formed of a conventional GaAs multiple quantum well, is contacted on opposing sides by the annular electrodes 12 and 16 and sandwiched between first and second contacting layers 22, 24 abutting respectively the first mirror stack 14 and a second mirror stack 26. The first mirror stack 14 defines a waveguide cavity which constrains the electromagnetic field and defines the radial optical mode profile. The axial mode of the electromagnetic field is defined by spacing of the reflective surfaces of the respective mirror stacks, which are characterized by a distributed-reflector-induced standing-wave pattern wherein the active region 20 is ideally placed at the maximum in the standing wave pattern and any optically-absorptive elements are disposed at nulls in the standing wave pattern, as is understood in the art. A first contacting region 22 is disposed above the active layer 20 in contact with the first annular electrode 12, and a second contacting region 24 is disposed below the active region in contact with the second electrode 16. (The second electrode may be either an annulus above the substrate or a contact outside the optical cavity, such as below the substrate.) Current is forced into the cavity by a current blocking layer 27 as shown in FIG. 3. According to the invention, there is a nonlinear vertical grading of resistivity in at least one of the contacting regions 22 or 24 between at least one of the electrodes 12 or 16 and the active layer 20. According to a further embodiment of the invention, and referring to FIGS. 3 and 5, at least one of the contacting regions 22 or 24 is formed of a layered distribution section or layer 28 which is highly conductive to radial current flow and of a current leveling section or layer 29 between the distribution section and the active layer, the current leveling section being more resistive to axial current flow than the resistance to radial current flow of the distribution section.

Figure 4:
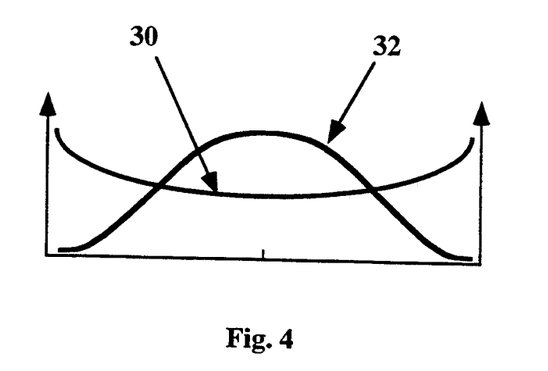
FIG. 4 is a diagram showing a mode profile and a current profile of a device as illustrated in FIG. 5.
Figure 5:
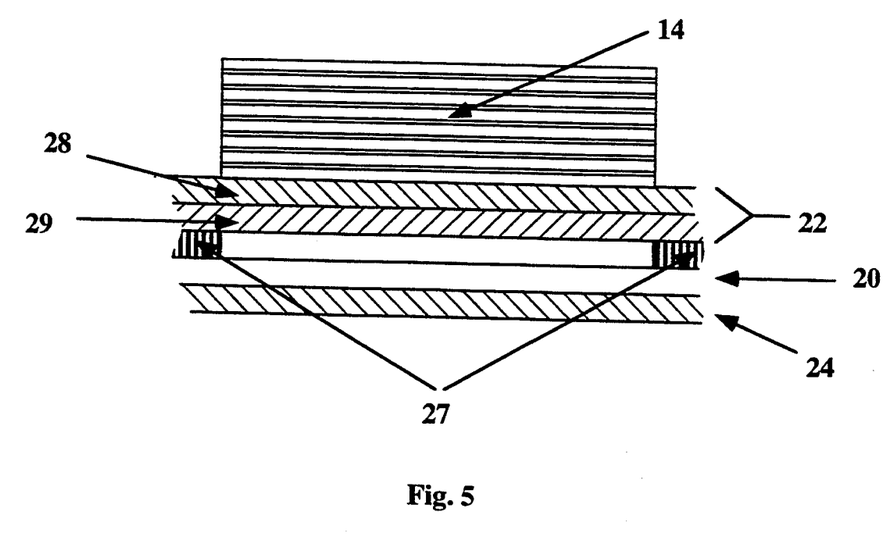
FIG. 5 is a side cross-sectional view of a detail of contacting and active regions of one VCSEL according to the invention.

Referring to FIG. 4, there is shown a current profile 30 and the radial optical mode profile 32 of a specific embodiment of the device 100 as illustrated in detail in FIG. 5. The current profile exhibits highest current flow into the active layer 20 around the perimeter (the sides of the figure) and less current flow toward the center of the active layer. Extreme current flow at the perimeter is called current crowding. In this embodiment, the current crowding phenomenon is constrained by the current leveling effects of the distribution section or layer 28 and more particularly by the effects of current leveling section or layer 29 illustrated in FIG. 5. The operation of the current leveling layer 29 in this fashion is not intuitive, and it is only apparent from experiment and careful modeling. Nevertheless, significant increased output power and efficiency is observable where a layer is interposed which is axially "resistive" as compared to the lateral resistance of an adjacent current distribution layer By "resistive" it is understood that the material resistance to current flow must be at least an order of magnitude and preferably about two orders of magnitude more resistive than the adjacent current distribution layer.

Figure 6:
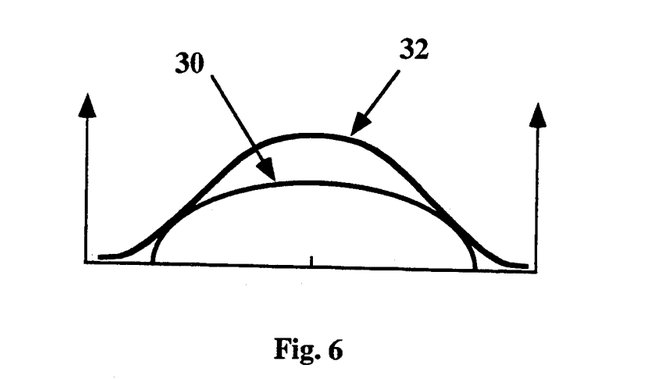
FIG. 6 is a diagram showing a mode profile and a current profile of a device as illustrated in FIG. 7.
Figure 7:
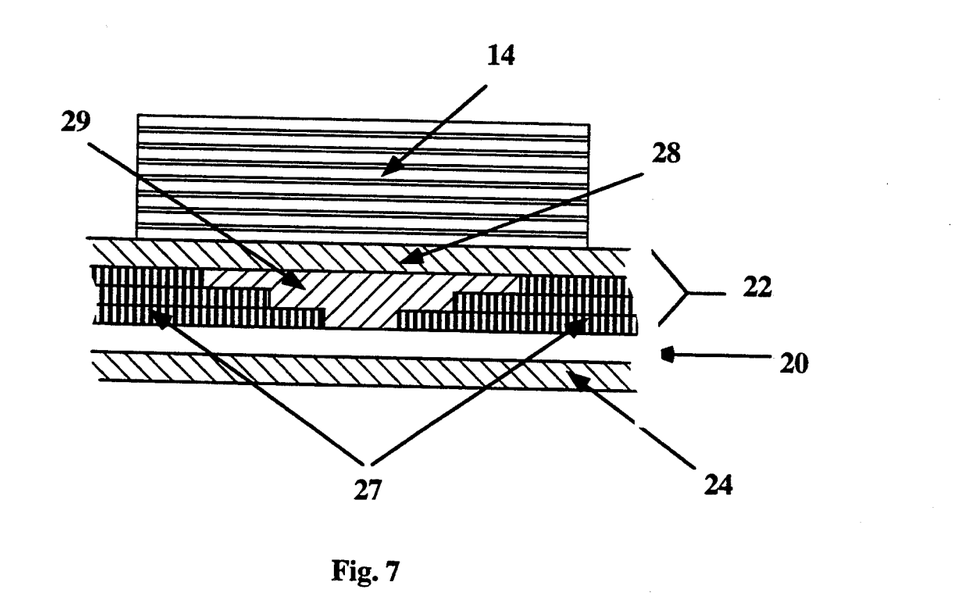
FIG. 7 is a side cross-sectional view of a detail of contacting and active regions of another VCSEL according to the invention.

Referring now to FIG. 6, there is shown a radial current profile for an embodiment of the invention as shown in FIG. 7, wherein the radial current profile 30 is constricted to increase the net gain of the fundamental optical mode 32 of the resonant cavity. The importance of constricting the current to a diameter smaller than the optical waveguide is not intuitive and it is only apparent from experiment and careful modeling. A constriction radius less that one-half the radius of the optical waveguide has been effectively employed. However, such a constriction has been found to be critical to improving device efficiency and promoting single mode operation. The current blocking layer 27 is formed by techniques that produce only small optical index discontinuities, thus allowing the current to be confined to a radial area smaller than the optical mode.

The structure of the device of FIG. 7 exhibits increased electron to photon conversion efficiency relative to the structure of FIG. 5 and preferentially supports single radial mode operation. In this embodiment, the current blocking layer 27 is on the same side of the active region as the distribution layer 28 and levelling layer 29. As can be seen in the figure, the current blocking layer is constructed of a plurality of layers of semiconductor materials. These layers each have differing optical indexes designed to provide optical feedback (including layers of one-quarter wavelength in thickness) to reduce absorption losses associated with the current blocking layer which is heavily doped. The current blocking layer could be formed by either ion implantation, multiple diffusion, or other similar techniques for altering the conductivity of the semiconductor. For example, silicon could be implanted into the p-type levelling layer 29 and then annealed, forming a buried current blocking n-type layer, as is known in the art. The upper mirror (14 in FIG. 3) could then be formed by depositing alternating dielectric layers or using epitaxial regrowth. In another embodiment, the distribution and current levelling layers would be grown as n-type wherein the current blocking layer is then formed by ion implantation of oxygen with subsequent annealing, as is known in the art.

Figure 8:
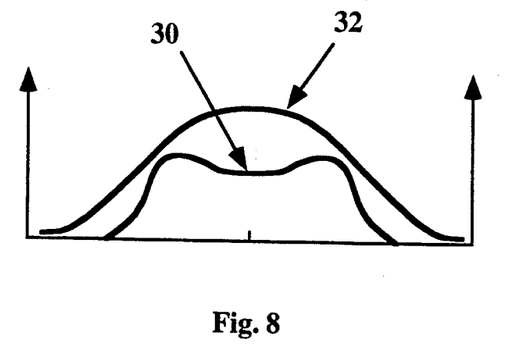
FIG. 8 is a diagram showing a mode profile and a current profile of a device as illustrated in FIG. 9.
Figure 9:
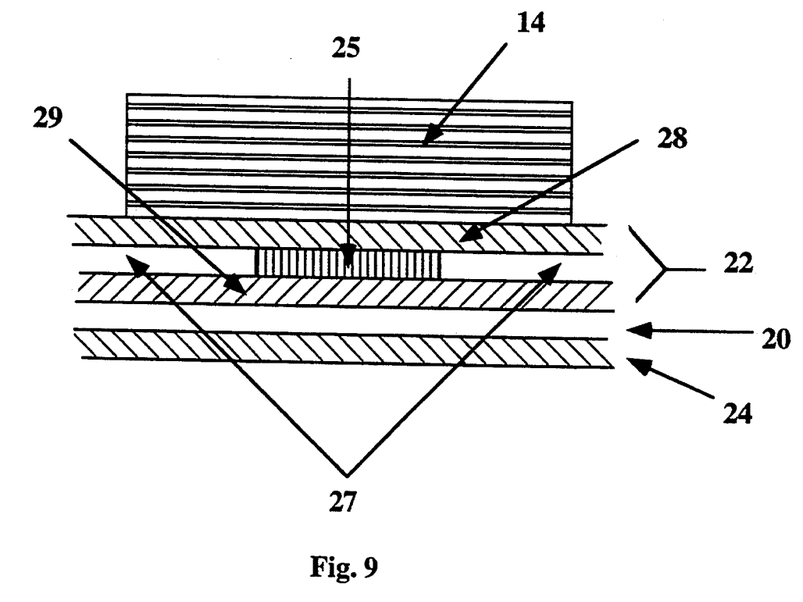
FIG. 9 is a side cross-sectional view of a detail of contacting and active regions of another VCSEL according to the invention.

Referring now to FIG. 8, there is shown a radial current profile for an embodiment of the invention as shown in FIG. 9, wherein the radial current profile 30 is constricted to increase the net gain of the fundamental optical mode 32 of the resonant cavity. The current blocking layer 27 is grown in the device between the distribution layer 28 and the current levelling layer 29. A punchthrough layer 25 is then formed to provide a current path through the active region in the optical cavity.

The structure of FIG. 9 exhibits enhanced electron-to-photon conversion efficiency relative to the structure of FIG. 5 and preferentially supports single radial mode operation. The punchthrough layer 25 could be formed by either ion implantation, diffusion, or other similar techniques. For example, the distribution layer 28 and current levelling layers 29 could be p-type while the current blocking layer 27 would then be n-type. The punchthrough layer 25 would be formed by ion implanting a p-type dopant, such as beryllium, and then annealing the device as is known in the art. The upper mirror (14 in FIG. 3) could then be formed by depositing alternating dielectric layers or using epitaxial regrowth.

Figure 10:
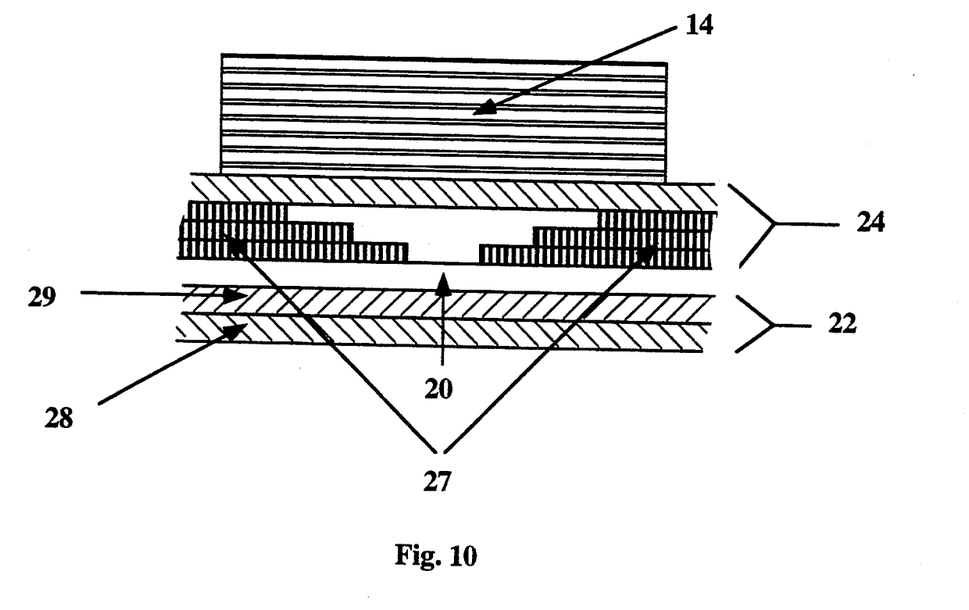
FIG. 10 is a side cross-sectional view of a detail of contacting and active regions of another VCSEL according to the invention, the layer sequence being inverted.

Referring now to FIG. 10, another structure is shown for achieving current levelling and radial aperturing of the current. Here the current distribution layer 28 and current levelling layer 29 are on the opposite side of the active region 20 relative to the current blocking layer 27 and the waveguide mirror stack 14. This inverted structure could be fabricated using the same techniques described for the structure of FIG. 7.

Figure 11:
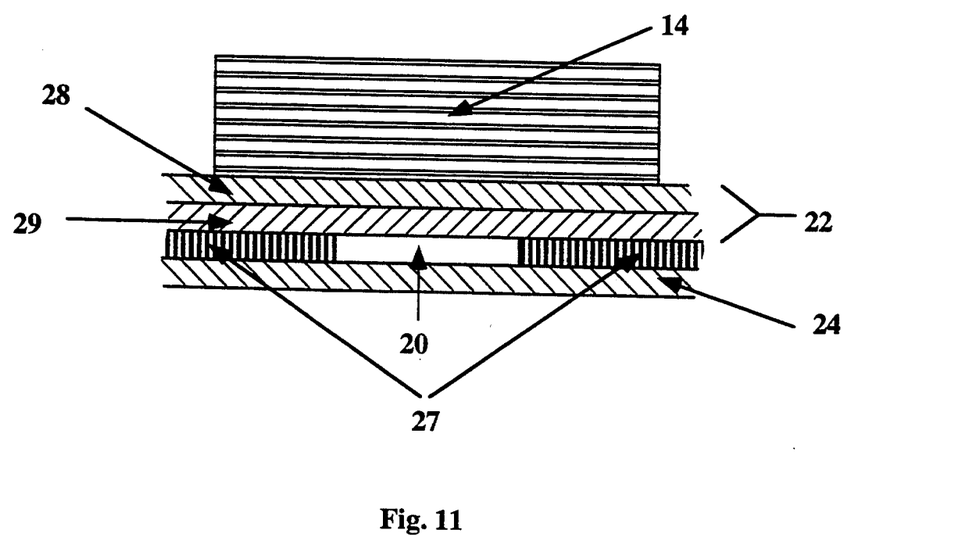
FIG. 11 is a side cross-sectional view of a detail of contacting and active regions of still another VCSEL according to the invention.

Referring now to FIG. 11, another structure is shown for achieving current levelling and radial aperturing of the current. Here the current blocking layer 27 is formed in the active material itself. This could be fabricated using ion implantation, focused ion beam or other techniques for introducing impurity atoms that disorder the active material 20. A lower bandgap of the non-disordered material results in a funneling of the current. Constriction of the active region also results in lower currents needed to induce lasing. This structure could be combined with the techniques described above in connection with other structures.

The invention has now been explained with reference to specific embodiments. Other embodiments will be apparent to those of ordinary skill in the art upon reference to this disclosure. It is therefore not intended that this invention be limited, except as indicated by the appended claims.

What is claimed is:

1. A vertical-cavity surface emitting laser device (VCSEL), said VCSEL device having an active region, first and second mirror stacks forming a resonant cavity, a radial like electrode configuration with a first electrode disposed largely around a base of the first mirror stack near a first side of the active region, a second electrode on an opposing second side of the active region, a first contacting region and a second contacting region on each first and second side of the active region in contact with said respective first electrode and said second electrode, each one of said contacting regions providing a current path for distributed current through the active region, the improvement comprising:

a nonlinear increasing resistivity profile in at least one of said contacting regions between at least one of said first or second electrodes and said active region where said increasing resistivity is such that the resistivity adjacent to said active region is at least one order of magnitude greater that the resistivity in contact with said first or second electrode to minimize current crowding at perimeter edges of said active region.

2. The device according to claim 1 wherein said first contacting region comprises:

a first layered section abutting said first electrode, said first layered section being highly conductive to radial current flow; and at least a second layered section between said first layered section and said active region, said second layered section being more resistive to longitudinal current flow than to radial current flow in said first layered section.

3. The device according to claim 2 wherein said first contacting region and said second contacting region each further comprises:

means for forming a radially graded resistivity profile so as to restrict the current injection to a smaller radius than the optical mode, thereby enhancing the gain of the fundamental optical mode of the resonant cavity and thus improving device efficiency.

4. The device according to claim 3 wherein the radially graded resistivity profile further comprises:

a radial grading of resistivity producing a current injection profile that preferentially supports single radial (lateral) mode operation by maximizing current injection near the center of the resonant cavity.

5. The device according to claim 4 wherein the radially-graded resistivity profile defines a constriction radius allowing current to flow within the constriction radius and blocking all current flow outside the constriction radius, the constriction radius being at least one micrometer less than that of the radius of the resonant cavity.

6. The device according to claim 3 wherein a current blocking layer is provided to restrict current to a radius at least one micrometer less than that of the resonant cavity.

7. The device according to claim 6 wherein said second layered section comprises a current blocking layer in an annulus around the center of the device.

8. The device according to claim 7 wherein said current blocking layer is formed by ion implantation.

9. The device according to claim 7 wherein said current blocking layer is formed by multiple diffusions.

10. The device according to claim 6 wherein said current blocking layer is incorporated into crystalline structure as grown, and a punch-through layer is formed in a central area in order to funnel the current.

11. The device according to claim 10 wherein said punch-through layer is formed by ion implantation.

12. The device according to claim 10 wherein said punch-through layer is formed by diffusion.

13. The device according to claim 2 wherein said second layered section comprises:
a plurality of layers of semiconductor materials of differing optical indexes designed to provide optical feedback, including layers of one-quarter wavelength in thickness), to reduce absorption losses associated with the first layered section, said first layered section being heavily doped.

14. The device according to claim 1 wherein said first contacting region and said second contacting region each further comprises:
means for forming a radially graded resistivity profile so as to restrict the current injection to a smaller radius than the optical mode, thereby enhancing the gain of the fundamental optical mode of the resonant cavity and thus improving device efficiency.

15. The device according to claim 14 wherein the radially graded resistivity profile further comprises:
a radial grading of resistivity producing a current injection profile that preferentially supports single radial (lateral) mode operation by maximizing current injection near the center of the resonant cavity.

16. The device according to claim 1 wherein said active region comprises:
a radially-bounded active region so as to confine carriers in a radius smaller than the optical mode of the resonant cavity, thereby enhancing the gain of the fundamental optical mode of the resonant cavity and thus improving device efficiency.

17. A method for constructing a vertical-cavity surface emitting laser device (VCSEL), said VCSEL device having an active region, first and second mirror stacks forming a resonant cavity, a radial electrode configuration with a first electrode disposed around a base of the first mirror stack near one side of the active region, a second electrode on the other side of the active region, a first contacting region and a second contacting region on each side of the active region in contact with said respective first electrode and said second electrode, each one of said contacting regions providing a current path for distributed current through the active region, the method comprising:
constructing a nonlinear grading of resistivity in at least one of said contacting regions between at least one of said first or second electrodes and said active region to minimize current crowding at perimeter edges of said active region by:
a) placing a second layered section upon said active region, said second layered section being more resistive to longitudinal current flow than to radial current flow in a first layered section;
b) placing a first layered section upon said second layered section, said first layered section being highly conductive to radial current flow; and
c) placing said one electrode in radial contact with said first layered section.

18. The method for construction according to claim 17 wherein construction of said second layered section of said first contacting region further comprises:
forming a radially graded resistivity profile so as to restrict the current injection to a radius less than that of the fundamental optical mode of the resonant cavity, thereby increasing efficiency and supporting single mode operation.

19. The method according to claim 18 further including the steps of:
growing a current blocking layer of opposite type doping between the second layered section and the first layered section, a current punch-through layer to be formed thereafter;
stopping the growth after forming said second layered section, said current blocking layer, and said first layered section, in order to implant ions of opposite type to the doping of the current blocking layer into the current blocking layer in the central region of the device, thereby establishing a current punch-through layer; and
forming a mirror stack on top of the distribution layer having a radius larger than the punch-through region.

20. A vertical-cavity surface emitting laser device (VCSEL), said VCSEL device having an active region, first and second mirror stacks forming a resonant cavity, a radial like electrode configuration with a first electrode disposed around a base of the first mirror stack near a first side of the active region, a second electrode on an opposing second side of the active region, a first contacting region and a second contacting region on each first and second side of the active region in contact with said respective first electrode and said second electrode, each one of said contacting regions providing a current path for distributed current through the active region, the improvement comprising:
a nonlinear grading of resistivity in at least one of said contacting regions between at least one of said first or second electrodes and said active region to minimize current crowding at perimeter edges of said active region;
and wherein said first contacting region comprises:
a first layered section abutting said first electrode, said first layered section being highly conductive to radial current flow; and
at least a second layered section between said first layered section and said active region, said second layered section being more resistive to longitudinal current flow than to radial current flow in said first layered section.

21. The device according to claim 20 wherein said first contacting region and said second contacting region each further comprises:
means for forming a radially graded resistivity profile so as to restrict the current injection to a smaller radius than the optical mode, thereby enhancing the gain of the fundamental optical mode of the resonant cavity and thus improving device efficiency.

22. The device according to claim 21 wherein the radially graded resistivity profile further comprises:
   a radial grading of resistivity producing a current injection profile that preferentially supports single radial (lateral) mode operation by maximizing current injection near the center of the resonant cavity.

23. The device according to claim 20 wherein said active region comprises:
   a radially-bounded active region so as to confine carriers in a radius smaller than the optical mode of the resonant cavity, thereby enhancing the gain of the fundamental optical mode of the resonant cavity and thus improving device efficiency.

* * * * *